(12) United States Patent
Brauch

(10) Patent No.: US 6,459,318 B1
(45) Date of Patent: Oct. 1, 2002

(54) PROGRAMMABLE DELAY CLOCK GATERS

(75) Inventor: Jeffrey C Brauch, Ft Collins, CO (US)

(73) Assignee: Hewlett-Packard Company, Palo Alto, CA (US)

(*) Notice: Subject to any disclaimer, the term of this patent is extended or adjusted under 35 U.S.C. 154(b) by 0 days.

(21) Appl. No.: 09/814,554

(22) Filed: Mar. 22, 2001

(51) Int. Cl.[7] .................................................. H03K 3/00
(52) U.S. Cl. ..................... 327/259; 327/108; 327/112; 326/95; 326/98
(58) Field of Search ................................ 327/239, 256, 327/257, 258, 259, 108, 112; 326/93, 95, 98

(56) References Cited

U.S. PATENT DOCUMENTS

| | | | |
|---|---|---|---|
| 4,692,637 A | * 9/1987 | Shoji | 327/292 |
| 4,992,682 A | * 2/1991 | Asano et al. | 327/298 |
| 5,041,738 A | * 8/1991 | Walters, Jr. | 327/130 |
| 5,124,572 A | 6/1992 | Mason et al. | 327/145 |
| 5,306,962 A | 4/1994 | Lamb | 327/259 |
| 5,418,179 A | * 5/1995 | Hotta | 437/57 |
| 5,543,736 A | * 8/1996 | Gardner et al. | 326/101 |
| 5,576,654 A | * 11/1996 | Shu et al. | 327/433 |
| 5,701,335 A | 12/1997 | Neudeck | 377/69 |
| 5,726,596 A | 3/1998 | Perez | 327/292 |
| 5,748,019 A | * 5/1998 | Wong et al. | 327/170 |
| 5,760,610 A | 6/1998 | Naffziger | 326/93 |
| RE36,469 E | * 12/1999 | Wood et al. | 257/685 |

* cited by examiner

*Primary Examiner*—Timothy P. Callahan
*Assistant Examiner*—An T. Luu
(74) *Attorney, Agent, or Firm*—Alexander J. Neudeck

(57) ABSTRACT

A non-overlapping clock generator that has its dead time adjustable without a complete re-design and re-fabrication. Certain terminals of certain devices of the non-overlapping clock generator are connected only by metal layers. This allows the circuit of the non-overlapping clock generator to be changed, adjusting the dead time, by changing only the masks used to fabricate the metal layers. This allows non-overlapping clock generators on wafers that have been partially fabricated to have their dead times altered from the original design.

12 Claims, 2 Drawing Sheets

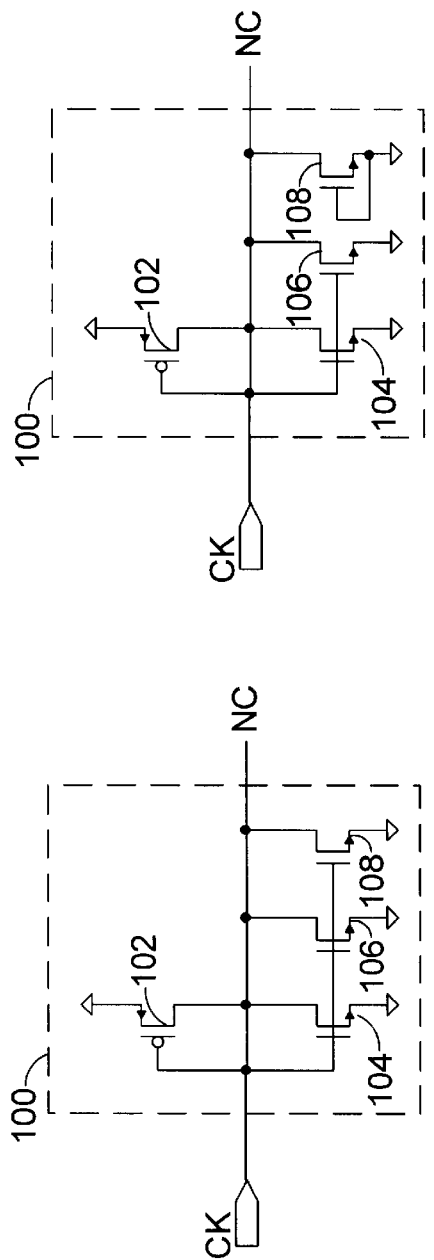
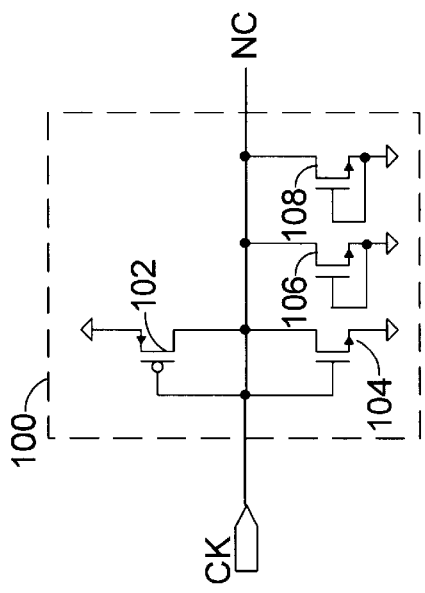

PROGRAMMABLE DELAY CLOCK GATERS

FIELD OF THE INVENTION

The present invention relates generally to clock buffer circuits used in VLSI integrated circuits, and, more particularly to a qualified non-overlapping clock generator/buffer.

BACKGROUND OF THE INVENTION

Qualified non-overlapping generators (also known as clock gaters) may be used to prevent data from "racing" from one latch to another thereby causing errors. Non-overlapping clock signals generated by clock gaters are typically clock signals which one clock signal has a rising edge that occurs after a falling edge of the other clock signal and a falling edge that occurs before a rising edge of the other clock signal. Such clock signals prevent races through latches by deactivating a subsequent stage before data is allowed to propagate through the current stage.

Several versions of clock gaters, and their use in an overall clocking scheme, have been presented in U.S. Pat. No. 5,124,572 to Mason et al., U.S. Pat. No. 5,306,962 to Lamb, U.S. Pat. No. 5,726,596 to Perez, U.S. Pat. No. 5,760,610 to Naffziger, and U.S. Pat. No. 5,701,335 to Neudeck. These documents are all hereby incorporated herein by reference.

One of the design tradeoffs encountered when using clock gaters involves the amount of time that both clocks are inactive (i.e. non-overlapping). This is also referred to as dead time. Decreasing the amount of dead time may increase the frequency of operation of the integrated circuit (IC) by allowing more time for circuits to evaluate when at least one clock is active. However, this decreased dead time also increases the risk that the circuit will have some timing errors due to unforeseen delays or race conditions in the design of the IC. With larger dead times, it is less likely that an unforeseen delay or race condition will cause errors.

Increasing the amount of dead time decreases the likelihood that unforeseen delays or race conditions will cause errors. However, the increased dead time reduces the amount of time available during a clock phase for circuitry to evaluate. This decreases the performance of the integrated circuit by requiring lower clock frequencies to provide the same amount of evaluate time per clock phase. These tradeoffs are typically made during the design of the integrated circuit and therefore typically require a re-design of the clock gaters and re-fabrication of the entire chip to increase or decrease dead time thereby getting the chip to function properly or improve performance, respectively.

Accordingly, there is a need in the art for a reduced cost way of manipulating the amount of dead time provided by clock gaters. The amount of dead time should be able to be manipulated on a circuit-by-circuit basis without having to re-design every clock gater and re-fabricate the entire chip from scratch.

SUMMARY OF THE INVENTION

The invention provides a non-overlapping clock generator that has its dead time adjustable without a complete re-design and re-fabrication. Certain terminals of certain devices of the non-overlapping clock generator are connected only by metal layers. This allows the circuit of the non-overlapping clock generator to be changed, adjusting the dead time, by changing only the masks used to fabricate the metal layers. This allows non-overlapping clock generators on wafers that have been partially fabricated to have their dead times altered from the original design.

Other aspects and advantages of the present invention will become apparent from the following detailed description, taken in conjunction with the accompanying drawings, illustrating by way of example the principles of the invention.

BRIEF DESCRIPTION OF THE DRAWINGS

FIGS. 2A, 2B, and 2C are a schematic illustrations of three P/N ratios obtainable on the input inverter of the non-overlapping clock generator.

DETAILED DESCRIPTION OF THE PREFERRED EMBODIMENTS

Figure 1:
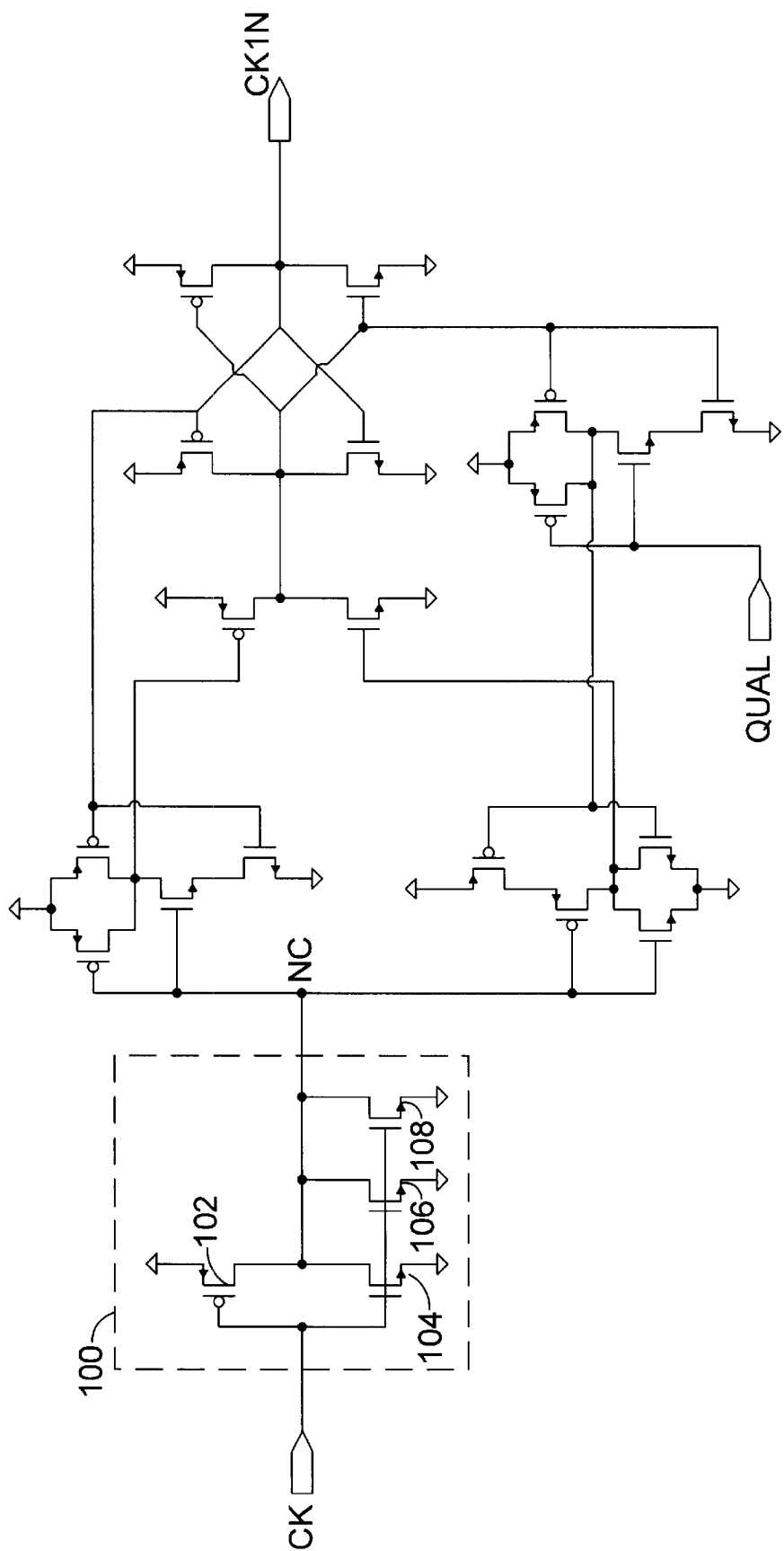
FIG. 1 is a schematic illustration of a non-overlapping clock generator having a metal mask adjustable dead time.

FIG. 1 is a schematic illustration of a non-overlapping clock generator having a metal mask adjustable dead time. Box 100 surrounds an input inverter to the non-overlapping clock generator. The input inverter 100 has an overlapping clock signal, CK, as an input. CK is connected to the gate of p-channel field effect transistor (PFET) 102 and the gates of n-channel field effect transistors (NFETs) 104, 106, and 108. The source of PFET 102 is connected to the positive supply voltage. The drain of PFET 102 is connected to the output node of inverter 100, signal NC. The sources of NFETs 104, 106, and 108 are connected to the negative supply voltage. The drains of NFETs 104, 106, and 108 are connected to signal NC.

In one embodiment, PFET 102 has a width-to-length ration of 23.95. NFET 104 has a width-to-length ration of 3.6. NFET 106 has a width-to-length ration of 1.2. NFET 108 has a width-to-length ration of 1.8. Accordingly, the P/N width ratio of inverter 100 as shown in FIG. 1 is approximately 3.6.

With careful layout of the mask layers used to fabricate inverter 100, NFETs 104, 106, and 108 may be connected in any of the configurations shown in FIGS. 2A–2C by making changes only in the metal mask layers. For example, this may be accomplished by ensuring that the gate of NFET 104 was connected to the gate of NFET 106 in at least one metal layer and no non-metal layers and by ensuring that the gate of NFET 106 was connected to the gate of NFET 108 in at least one metal layer and no non-metal layers and that the negative supply voltage was also capable of being connected to the gates of NFET 106 and NFET 108 with a metal-only connection. Also, although not shown if the figures, the gate of NFET 104 could also be made capable of being disconnected and reconnected in a manner similar to that described for NFETs 106 and 108.

In an embodiment of the invention, the metal layers referred to above could be chosen to be the top, or near to the top, metal layers. This may allow them to be modified by after-manufacture methods such as by a focused ion beam (FIB) device. These after-manufacture methods would not require the production or re-layout of mask layers to change the configuration of inverter 100.

If the width-to-length ratios for NFETs 104, 106, and 108 described above are used, then FIG. 2A illustrates an inverter 100 configuration that has a PN width ratio of approximately 3.6. FIG. 2B illustrates an inverter 100 configuration that has a P/N width ratio of approximately 5.0. FIG. 2C illustrates an inverter 100 configuration that has a P/N width ratio of approximately 6.7.

A component of the delay of inverter 100 is determined by the P/N width ration of inverter 100. Accordingly, the delay of inverter 100 may be adjusted by wiring inverter 100 in the different configurations shown in FIGS. 2A–2C. In general, the larger the P/N ratio, the more delay between CK rising and NC falling. Signal NC falling ultimately causes the output of the non-overlapping clock generator, CKIN, to rise, Therefore, the larger the PIN ratio of inverter 100, the greater the dead time caused by the non-overlapping clock generator.

Although a specific embodiment of the invention has been described and illustrated, the invention is not to be limited to the specific forms or arrangements of part so described and illustrated. The invention is limited only by the claims.

What is claimed is:

1. A non-overlapping clock generator having a first dead time, comprising:

an inverter having a first delay when at least first and second switching device of a same type are both operational and controlled by a first clock signal and wherein when said first switching device has a first control terminal connected to a second terminal of said first switching device thereby keeping said first switching device in a non-operational off state causing said first inverter to have a second delay and said non-overlapping clock generator to have a second dead time.

2. The non-overlapping clock generator of claim 1 wherein said first. switching device and said second switching device are NFETs.

3. The non-overlapping clock generator of claim 1 wherein said first switching device and said second switching device are PFETs.

4. The non-overlapping clock generator of claim 1 wherein said first control terminal is connected to said second terminal of said first switching device by changing a metal pattern that used to connect said first control terminal to a second control terminal of said second switching device.

5. The non-overlapping clock generator of claim 1 wherein said second delay is greater than said first delay and said second dead time is greater than said first dead time.

6. The non-overlapping clock generator of claim 1 wherein said non-overlapping clock generator is fabricated on an integrated circuit and said first control terminal is connected to said second terminal of said first switching device after normal fabrication of said integrated circuit is complete.

7. A method of increasing a dead time between a pair of clocks generated by non-overlapping clock generators, comprising:

disconnecting a first control terminal of a first device of an inverter from a second control terminal of a second device of an inverter wherein said first and second device are of a same type; and, connecting said first control terminal of said first device to a second terminal of said first device thereby preventing said first device from switching on thereby increasing a delay of said inverter which thereby increases a dead time of said non-overlapping clock generator.

8. The method of claim 7 wherein said first device and said second device are NFETs.

9. The method of claim 7 wherein said first device and said second device are PFETs.

10. A method of decreasing a dead time between a pair of clocks generated by non-overlapping clock generators, comprising:

connecting a first control terminal of a first device of an inverter to a second control terminal of a second device of an inverter wherein said first and second device are of a same type; and, disconnecting said first control terminal of said first device from a second terminal of said first device thereby allowing said first device to switch on thereby decreasing a delay of said inverter which thereby decreases a dead time of said non-overlapping clock generator.

11. The method of claim 10 wherein said first device and said second device are NFETs.

12. The method of claim 10 wherein said first device and said second device are PFETs.

\* \* \* \* \*